US006995624B2

(12) United States Patent
Vanselow

(10) Patent No.: US 6,995,624 B2
(45) Date of Patent: Feb. 7, 2006

(54) OSCILLATOR CIRCUIT HAVING A COPY OF THE ACTIVATING COMPONENT

(75) Inventor: Frank Vanselow, Freising (DE)

(73) Assignee: Texas Instruments Incorporated, Dallas, TX (US)

(*) Notice: Subject to any disclaimer, the term of this patent is extended or adjusted under 35 U.S.C. 154(b) by 134 days.

(21) Appl. No.: 10/677,796

(22) Filed: Oct. 2, 2003

(65) Prior Publication Data

US 2004/0108909 A1 Jun. 10, 2004

(30) Foreign Application Priority Data

Oct. 8, 2002 (DE) .............................. 102 46 844

(51) Int. Cl.
*H03B 5/00* (2006.01)
(52) U.S. Cl. ................... 331/117 R; 331/186
(58) Field of Classification Search ............ 331/117 R, 331/117 FE, 177 V, 185, 186, 176
See application file for complete search history.

(56) References Cited

U.S. PATENT DOCUMENTS

| | | | | |
|---|---|---|---|---|
| 6,731,182 B2 * | 5/2004 | Sakurai | ................... | 331/177 V |
| 2003/0189468 A1 * | 10/2003 | Traub | ..................... | 331/117 R |
| 2003/0231072 A1 * | 12/2003 | Mason | ................... | 331/117 R |

\* cited by examiner

*Primary Examiner*—Joseph Chang
(74) *Attorney, Agent, or Firm*—W. Daniel Swayze, Jr.; W. James Brady; Frederick J. Telecky, Jr.

(57) ABSTRACT

Oscillator circuit with an LC resonant circuit 1, an activating component 2 connected to the LC resonant circuit 1, which serves to compensate for the losses occurring in the LC resonant circuit 1, where the series-configuration of both the LC resonant circuit 1 and the activating component 2 is connected by way of a current-defining element, which sets the current flowing between a first voltage VDD and a second voltage VSS, which is different from the first voltage VDD.

11 Claims, 2 Drawing Sheets

OSCILLATOR CIRCUIT HAVING A COPY OF THE ACTIVATING COMPONENT

RELATED APPLICATION

This application claims the priority under 35 U.S.C. § 119 of German application No. 10246844.3, filed Oct. 8, 2002 and incorporated herein by reference.

FIELD OF THE INVENTION

The invention relates to an oscillator circuit with an LC resonant circuit.

BACKGROUND OF THE INVENTION

Such a circuit can be used, for example, in voltage controlled oscillators (VCOs), where the resonant circuit may, for example, contain a varactor, by means of which the resonant frequency of the tuned circuit can be adjusted. An essential criterion for the proper function of a voltage controlled oscillator is its phase noise. Up to now, these oscillator circuits tended to use MOS-FETs as current-defining elements, that is as current sources. An NMOS-FET is used in most cases, the current of which is defined by means of a current mirror in combination with a band separation reference voltage generating circuit. A disadvantage of using MOS-FETs is their suscectivity to I/f noise, in particular at low frequencies, which in such VCOs then has a material influence on the phase noise of the VCO. The I/f noise is hereby proportional to the gate surface of the MOS-FET (WxL). In the case of semiconductor manufacturing processes for the production of digital and VCO containing PLL circuits, which are used at present, and where the gate length of the MOS-FET is smaller than 0.2 micrometers, the I/f noise of the MOS current source therefore constitutes the decisive influence on the phase noise of the VCO. This influence of the I/f noise becomes even greater if bonded wires are used as the inductances of the LC resonant circuit of the oscillator circuit, which are much liked in such applications because of their high Q factor, and even then contribute very little to the phase noise of the VCO.

Several attempts have been made so far to reduce the influence of I/f noise of MOS-FETs in oscillator circuits.

In an article "Reducing MOS-FET I/f noise and power consumption by switched biasing" by Eric A. M. Klumperink et. al. in the IEEE JOURNAL OF SOLID-STATE CIRCUITS, Vol 35, issue 7th Jul. 2000, a MOS transistor is described as a current source in an oscillator circuit that is alternately operated in either its "strong inversion" or in its saturation state, whereby the source-gate voltage is switched back and forth between different values, in order to minimize the I/f noise of the MOS transistor. But the I/f noise in this case cannot be completely eliminated, because the MOS transistor that is used as a current source still contributes to the I/f noise to a considerable extent, as can be appreciated in FIG. 3 of the publication.

An afore-mentioned oscillator circuit is described for example in the article "A packaged 1.1 GHz CMOS VCO with phase noise of −126 dBc/Hz at a 600 kHz offset" by C.-M. Hung and Kenneth K. O. in the IEEE JOURNAL OF SOLIDSTATE CIRCUITS, Vol. 35, Issue No. 1, 1 Jan. 2000, page 100 and following, and represented in FIG. 1 of that publication. The circuit described obtains a reduction of the phase noise, among other factors, by the use of several inductances that are located on the chip. A disadvantage of this type of oscillator consists in an increased use of space caused by the additional inductances. The current source of this oscillator furthermore makes use of a PMOS FET with buried channel, in order to achieve a further I/f noise reduction. However, since MOS FETs are still being used, considerable I/f noise can still be expected, as is represented in FIG. 3 of the publication.

SUMMARY OF THE INVENTION

The object of the present invention consists in creating an oscillator circuit, where the influence of I/f noise is considerably reduced.

This requirement is met by an oscillator circuit, which in that the current-defining element includes of an ohmic resistance and in that the oscillator circuit furthermore comprises a control loop circuit, which serves to set the current flowing through the activating component to a predetermined constant value.

By using a resistive element to essentially determine the current flowing through the activating component, the influence of the I/f noise can be considerable reduced, since an ohmic resistance normally only generates a thermal noise (known as "white noise"). But even the influence of thermal noise is very low at the low resistance values that can normally be used, and is below the noise component that is produced by the remaining elements of the LC resonant circuit and the activating component. A disadvantage in the manufacture of the oscillator circuit in an integrated form consists, however, in that on account of production related tolerances, the resistance value cannot be adjusted with sufficient precision to achieve the optimum operating conditions for the oscillator. A control loop circuit is therefore provided, which corrects the current flowing through the resistor in such a way that optimum operating conditions can be achieved. The control loop circuit furthermore serves to compensate for and to protect the circuit components from changing ambient conditions, such as changes in temperature.

BRIEF DESCRIPTION OF THE DRAWINGS

The invention shall now be explained in detail by way of an embodiment example with the help of drawings, where.

DETAILED DESCRIPTION OF THE INVENTION

Figure 1:
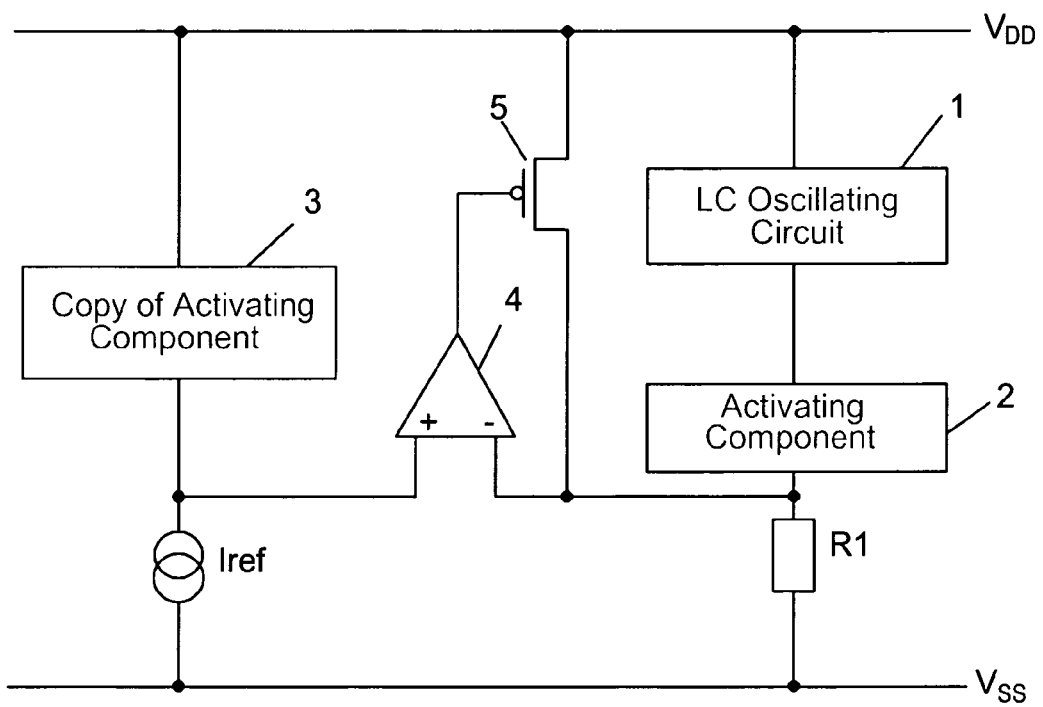
FIG. 1 shows a block diagram of a first embodiment of an oscillator circuit according to the invention.

FIG. 1 shows an embodiment of an oscillator circuit according to the present invention, where an LC resonant circuit 1, containing at least one inductance and one capacitance, is connected to a supply voltage VDD. The LC resonant circuit may include, for example, of a coil and a capacitor, connected either in parallel or in series. The LC resonant circuit 1 is connected to an activating component 2, which serves to compensate for the losses in the LC resonant circuit 1, which are caused by damping effects. The activating component 2 is connected to a resistor R1, which is furthermore connected to ground potential VSS.

The oscillator circuit according to the invention represented in FIG. 1 furthermore comprises a control loop circuit, which comprises a copy 3 of the 10 activating component that is also connected to the supply voltage VDD. The copy 3 of the activating component is furthermore connected to the ground potential VSS by way of a reference current source Iref. The voltage present at a joining point between the copy 3 of the activating component and the reference current source is applied to the input of an operational amplifier 4 to whose other input is applied the voltage present at the joining point between the resistor 1 and the activating component 2. The output signal of the operational amplifier 4 controls the gate of a PMOS FET 5, which is connected in parallel to series-connected LC resonant circuit 1 and the activating component 2.

Figure 2:
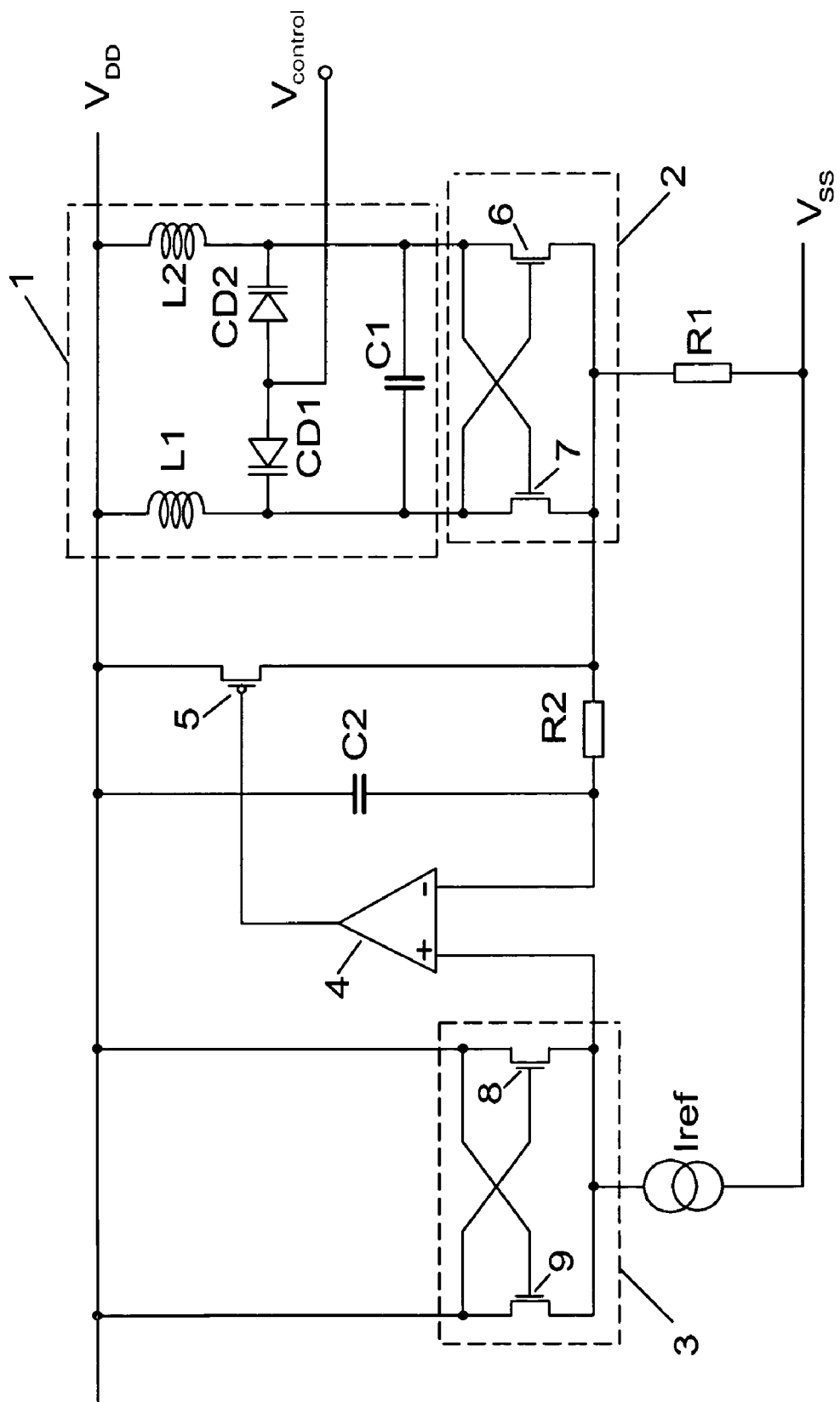
FIG. 2 is a detailed block diagram of a second embodiment of an oscillator circuit according to the invention.

FIG. 2 shows a second embodiment of the oscillator circuit according to the present invention that is similar to the embodiment version represented in FIG. 1, whereby in the embodiment version represented in FIG. 2, the blocks used in FIG. 1 are replaced by concrete circuit elements.

The LC resonant circuit 1 includes a parallel resonant circuit with one first inductance L1 and a second inductance L2, one end of each being connected to the supply voltage VDD. The capacitance value of the resonant circuit is made up of the capacitor C1 of fixed capacitance value, and two varactors CD1 and CD2, the anodes of which being connected to each other and whose cathodes are connected to the other ends of the inductances L1 and L2, respectively. A control voltage Vcontrol is furthermore applied to the anodes of the varactors CD1 and CD2, to enable the capacitance, and therefore the resonant frequency of the LC circuit, to be varied and set in a flexible manner, as is required, for example, in the case of a VCO.

The activating component 2 consists of a first NMOS FET 6 and a second NMOS FET 7, each of whose source terminals being connected to the resistor and whose drain terminals are each connected to the LC resonant circuit, whereby their gate terminals are connected in each case to the drain terminal of the other NMOS FET.

Such an embodiment of an LC resonant circuit 1 and of an activating component 2 is known according to the technological state of the art and described in, for example, the IEEE publication by Hung et al.

The operation of these two elements shall therefore not be gone into in more detail.

The copy 3 of the activating component is embodied in the same way as the activating component 2, and consists of a third NMOS FET 8 and a fourth NMOS FET 9, whose source terminals each being connected to the reference current source Iref, and their drain terminals being connected to the supply voltage VDD, whereby their gate terminals are each connected to the drain terminal of the other NMOS FET.

The source terminals of both the first NMOS FET 6 and of the second NMOSFET 7 are connected to one of the inputs of the operational amplifier 4, whilst the source terminals of the third NMOS FET 8 and of the fourth NMOS FET 9 are connected to the other input of the operational amplifier 4.

In the case of the embodiment described, all circuit elements, including the resistor 1, are in integrated form.

The use of a resistor, instead of the previously used MOS FET to define the current flowing through the activating component, has essential advantages, since the I/f noise of the resistor is virtually zero. The resistor only generates thermal noise, which however may be ignored when compared with the noise originating from the coils and transistors, since its resistance will normally be of a very low ohmic value (in existing embodiments this will be within a range of 150 to 200 Ohms, at a supply voltage VDD of 1.8 volts).

Because of the production tolerances unavoidable in the semi-conductor manufacturing process used, the resistor 1 can, however, not always be produced so as to be within a suitable resistance range for setting the optimum operating point of the oscillator.

The purpose of the resistor R1 is to set the current flowing through the source-drain paths of the NMOS FETs 6 and 7 of the activating component 2.

The current flowing through the resistor R1 must be set to a value sufficiently high so that oscillation of the LC resonant circuit 1 will positively be able to start. A certain tolerance range must hereby be taken into account, which is due to process-related differences of element parameters (Q-factor of coils, capacitors and varactors). Changes in temperature that may occur during the operation of the oscillator circuit and that may have an influence on the characteristic values of the circuit elements must furthermore be taken into consideration. The current must also be sufficiently high to make sure that any buffer circuits at the output of the oscillator circuit will be able to positively process the signals received. In addition to this, the current setting also has a certain influence on the noise. On the other hand, it is of course desirable to adjust the current setting to the lowest possible value, in order to minimize the energy consumption of the oscillator circuit. It has furthermore to be taken into consideration that certain current intensities must not be exceeded to ensure the optimum and positive operation of specific circuit elements.

The control loop circuit here serves to counteract the deviations of the oscillator from the optimum operating point, due to manufacturing tolerances of the resistor R1 (as well as to temperature changes), and to maintain the current flowing through the activating component 2 at a constant optimum value.

If the resistance of the resistor R1 becomes smaller than desired, for example on account of production tolerances, the current flowing through the source-drain path of the second NMOS FET 7 of the activating component 2 increases. This then also implies an increase of the gate-source voltage at the second NMOS FET 7, which then exceeds the gate-source voltage of the third NMOS FET 8 of the copy 3 of the activating component. At the output of the operational amplifier 4, which at its input compares these two gate-source voltages with each other, a signal at a differing level is then output, which controls the gate of the PMOS FET 5 so as to cause a greater current to flow through its source-drain path, in its turn causing the voltage at the source terminal of the second NMOS FET 7 to increase, so that its gate-source voltage, and therefore also the current flowing through the source-drain paths of the two transistors 6 and 7, is reduced. In this way, the current flowing through the activating component 2 will again be returned to its optimum value. Should the resistance of resistor R1 become greater than desired; the circuit will function in a reverse manner.

The second resistor R2, connected between the source terminal of the second NMOS FET 7 and one of the inputs of the operational amplifier 4, as well as the second capacitor that is connected between the supply voltage VDD and one of the ends of the resistor R2, constitute a low-pass filter, which serves to stabilize the control loop in the control loop circuit and to prevent the oscillation of the control loop circuit.

The reference current Iref is normally set smaller by several magnitudes than the optimum current through the resistor R1, whereby the current consumption caused by the control loop circuit can be kept to a low value. In the present embodiment example, the reference current Iref may for example be set at approximately 100 microampere, whilst the current flowing through the resistor R1 may be in the region of 8 milliamps.

The NMOS FETs of the copy 3 of the activating component are furthermore made considerably larger than the NMOS FETs of the activating component 2, in order to keep the noise introduced by the control loop circuit itself as low as possible. The NMOS FETs of the activating component may, for example, have a gate length of 1.4 micrometers, whilst the NMOS FETs of the copy of the activating component may have a length of 8 micrometers. This is made possible because the requirements made of the NMOS FETs of the copy 3 of the activating component, where the speed reduces with increased gate length, are considerable lower than those made of the NMOS FETs of the activating component 2. Whilst the NMOS FETs of the activating component in the present embodiment form can operate in the GHz range, the Hz range of operation is sufficient for the NMOS FETs of the copy of the activating component.

It should also be pointed out that the LC resonant circuit is not required for the copy 3 of the activating circuit, since only the DC component is here to be controlled.

The oscillator circuit represented in FIG. 2 may be used, for example, in a VCO circuit, which will then exhibit a particularly low phase nose. The VCO may be made part of a PLL. A preferred application of the oscillator circuit according to the invention will be found in digital PLL circuits that are produced following a standard manufacturing process, whereby the gate length of the NMOS FETs is less than 0.2 micrometers.

The expert will immediately realize that the embodiment versions described have only been chosen by way of examples, and a plurality of modifications is conceivable.

It is not a necessary requirement, for example, for the capacitance of the LC resonant circuit to be tuneable, and a fixed-value capacitor may be used instead. Bonded wires may also preferably be used for the inductances, which are positioned on the chip. Also, the activating component may, for example, make use of only one transistor. It is also not essential for the control loop circuit to contain a copy of the activating component, but it can for example also consist of a simple reference voltage generating circuit. The resistor R1 can, of course, also be positioned in different ways, and it may, for example, also be connected to the supply voltage VDD.

What is claimed is:

1. Oscillator circuit comprising:
    an LC resonant circuit (1),
    an activating component (2) connected to the LC resonant circuit (1), which serves to compensate for the losses occurring in the LC resonant circuit (1), whereby the series-configuration of both the LC resonant circuit (1) and the activating component (2),
    a current-defining element which connects the LC resonant circuit and the activating component, which sets the current flowing through the activating component (2), between a first voltage (VDD) and a second voltage (VSS), which is different from the first voltage (VDD), and
    wherein the current-defining element includes an ohmic resistance (R1) and wherein the oscillator circuit furthermore comprises a control loop circuit, which serves to set the current flowing through the activating component (2) to a pre-determined constant value,
    wherein the control loop circuit comprises a copy (3) of the activating component.

2. Oscillator circuit according to claim 1, wherein the control loop circuit furthermore comprises a reference current source (Iref), which is connected to the copy (3) of the activating component.

3. Oscillator circuit according to claim 1 wherein said oscillator circuit furthermore comprises a low-pass filter (C2, R2).

4. Oscillator circuit as in claim 1, wherein the ohmic resistor (R1) is integrated.

5. Oscillator circuit as in claim 1, wherein the reference current (Iref) is lower by a specific factor than the current flowing through the resistor (R1).

6. Oscillator circuit as in claim 1, wherein all circuit elements are in integrated form.

7. Oscillator circuit as in claim 1, wherein the activating component (2) comprises a first MOS FET (6) and a second MOS FET (7), whose source terminals are each connected to the resistor, and whose drain terminals are each connected to the LC resonant circuit (1), whereby the gate terminal is in each case connected to the drain terminal of the corresponding other MOS FET.

8. Oscillator circuit as in claim 1, wherein the first voltage is a supply voltage (VDD) and the second voltage is ground potential (VSS).

9. Oscillator circuit according to claim 8, wherein the LC resonant circuit (1) is connected to the supply voltage (VDD), and the resistor (R1) is connected between the activating circuit and ground potential (VSS).

10. Oscillator circuit comprising:
    an LC resonant circuit (1),
    an activating component (2) connected to the LC resonant circuit (1), which serves to compensate for the losses occurring in the LC resonant circuit (1), whereby the series-configuration of both the LC resonant circuit (1) and the activating component (2),
    a current-defining element which connects the LC resonant circuit and the activating component, which sets a current flowing through the activating component (2), between a first voltage (VDD) and a second voltage (VSS), which is different from the first voltage (VDD), and
    wherein the current-defining element includes an ohmic resistance (R1) and wherein the oscillator circuit furthermore comprises a control loon circuit, which serves to set the current flowing through the activating component (2) to a pre-determined constant value,
    wherein said oscillator circuit furthermore comprises an operational amplifier (4), to one of whose inputs is applied the voltage present at the activating component (2), and to whose other input is applied the voltage present at a copy of the activating component (3), and whose output signal controls a transistor (5) that is connected in parallel to the series-connected control loop circuit, consisting of the LC resonant circuit (1) and the activating component (2).

11. Oscillator circuit comprising:
    an LC resonant circuit (1),
    an activating component (2) connected to the LC resonant circuit (1), which serves to compensate for the losses occurring in the LC resonant circuit (1), whereby the series-configuration of both the LC resonant circuit (1) and the activating component (2),
    a current-defining element which connects the LC resonant circuit and the activating component, which sets a current flowing through the activating component (2), between a first voltage (VDD) and a second voltage (VSS), which is different from the first voltage (VDD), and wherein the current-defining element includes an ohmic resistance (R1) and wherein the oscillator circuit furthermore comprises a control loop circuit, which serves to set the current flowing through the activating component (2) to a pre-determined constant value, wherein the activating component comprises the MOS FETs (6, 7), and where the length of the gates of the MOS FETs (8, 9) of a copy (3) of the activating component is greater by a specific factor than the length of the gates of the MOS FETs (6, 7) of the activating component (2).

* * * * *